(12) United States Patent  (10) Patent No.: US 9,021,177 B2
Segal et al.  (45) Date of Patent: Apr. 28, 2015

(54) SYSTEM AND METHOD FOR ALLOCATING AND USING SPARE BLOCKS IN A FLASH MEMORY

(75) Inventors: Avigdor Segal, Netanya (IL); Igal Maly, Tel Aviv (IL)

(73) Assignee: Densbits Technologies Ltd., Haifa (IL)

( * ) Notice: Subject to any disclaimer, the term of this patent is extended or adjusted under 35 U.S.C. 154(b) by 360 days.

(21) Appl. No.: 13/096,736

(22) Filed: Apr. 28, 2011

(65) Prior Publication Data

US 2011/0271043 A1  Nov. 3, 2011

Related U.S. Application Data

(60) Provisional application No. 61/329,366, filed on Apr. 29, 2010.

(51) Int. Cl.
*G06F 12/00* (2006.01)
*G11C 29/00* (2006.01)
*G06F 12/02* (2006.01)

(52) U.S. Cl.
CPC ............ *G11C 29/82* (2013.01); *G06F 12/0246* (2013.01)

(58) Field of Classification Search
CPC ................ G06F 2212/7211; G06F 2212/7204; G06F 2212/7202; G06F 2212/1036; G06F 3/0616; G06F 12/0638
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |

(Continued)

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.

(Continued)

*Primary Examiner* — Aimee Li
*Assistant Examiner* — Michael C Kolb
(74) *Attorney, Agent, or Firm* — Dentons US LLP

(57) ABSTRACT

A method for using a single spare block pool in flash memory comprising: allocating a plurality of flash memory arrays, wherein each flash memory array comprises a plurality of flash memory blocks; within a main flash memory array: allocating a used block pool comprising a plurality of used blocks and allocating a main spare block pool comprising a plurality of spare blocks; within each of the other flash memory arrays: allocating a used block pool comprising multiple used blocks; allocating a minimum spare block pool comprising a minimum number of spare blocks; allocating the main spare block pool and each of the minimum spare block pools to a single spare block pool; transferring a spare block from the main spare block pool to one of the minimum spare block pools; and transferring a spare block from a first minimum spare block pool to a second minimum spare block pool.

16 Claims, 4 Drawing Sheets

(56) References Cited

U.S. PATENT DOCUMENTS

| | | |
|---|---|---|
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1* | 5/2008 | Kim et al. ............... 365/200 |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0209114 A1* | 8/2008 | Chow et al. ............. 711/103 |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |

(56) References Cited

U.S. PATENT DOCUMENTS

| | | |
|---|---|---|
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0300269 A1* | 12/2009 | Radke et al. ............ 711/103 |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1* | 7/2010 | Gorobets et al. ....... 365/185.09 |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1* | 9/2010 | Sugimoto et al. ............ 711/103 |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0246391 A1* | 9/2012 | Meir et al. ............ 711/103 |

OTHER PUBLICATIONS

Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 20091072100 A3.
Search Report of PCT Patent Application WO 20091053963 A3.
Search Report of PCT Patent Application WO 20091053962 A3.
Search Report of PCT Patent Application WO 20091053961 A3.
Search Report of PCT Patent Application WO 20091037697 A3.
Yani Chen, Keshab K. Parhi, "Small Area Parallel Chien Search Architectures for Long BCH Codes", Ieee Transactions on Very Large Scale Integration( VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC STANDARD, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

SYSTEM AND METHOD FOR ALLOCATING AND USING SPARE BLOCKS IN A FLASH MEMORY

CROSS-REFERENCE TO RELATED APPLICATION

This application claims the benefit of U.S. Provisional Patent Application No. 61/329,366, filed Apr. 29, 2010, which is incorporated herein by reference in its entirety.

FIELD OF THE INVENTION

Embodiments of the present invention relate generally to systems and methods involving multi-level non-volatile memory, and particularly to allocating and/or using a spare block pool in such a memory device.

BACKGROUND OF THE INVENTION

Flash memory devices, which include arrays of Flash memory cells, are used in many applications for storing digital information. Flash memory is frequently used in portable electronic devices, digital cameras, personal computers, memory cards, and other types of devices. Due to the nature of these devices, the endurance, speed, and longevity of the Flash memory are important.

Flash memory devices may store data in arrays of Flash memory cells, including single-level and/or multi-level cells. A single level cell (SLC) flash memory stores one bit of information per cell, typically by programming and reading a binary charge (e.g., high or low charge). In contrast, multi-level cells (MLC) store multiple bits of information in each cell by programming and reading a level of charge in the cell. Multi-level cells may include cells that store two bits (MLCx2), three bits (MLCx3), N bits (MLCxN), etc. Flash memory cells are organized into blocks within the array, and the blocks may be arranged by block type into flash memory arrays, or populations of block types.

The majority of blocks in a Flash memory device are usable blocks, or good blocks. However, inevitably, every Flash device includes non-functional blocks, commonly referred to as bad blocks, which may be incapable of being erased or rewritten with new information for any number of reasons. Typically, a Flash memory device may include some bad blocks at the beginning of the life of the device, and the number of bad blocks typically increases during the lifetime of the device. Flash memory blocks can become bad from any number of reasons. For example, each block of flash memory is limited in the number of times the data therein can be programmed and erased, characterized by a maximum program/erase (P/E) cycle. Thus, if a block of the Flash memory has been programmed and erased a number of times exceeding the P/E cycle maximum, it may turn bad. Flash memory blocks may also become bad blocks by erase failure, or other causes.

In most instances, the capacity of a memory card or other device using Flash memory (referred to generally as a Flash device) must be guaranteed during a rated lifetime of the device. The Flash device capacity may be directly limited by the number of usable blocks available to store data. Therefore, in order to ensure that the card capacity is maintained throughout the rated lifetime of the Flash device, a system designer may allocate a certain amount of usable blocks in a spare pool to allow switching of good spare blocks instead of bad used blocks during usage. Maintaining a pool of spare blocks from which good blocks may be drawn upon in exchange for bad blocks allows a requisite number of usable blocks to be ensured throughout the life of the device.

In MLC flash memory devices, memory blocks may be used as different types, for example SLC, MLCx2, MLCx3 blocks, etc., each of which may have different reliability specifications. Due to the differing reliability specifications of each data block type, a designer may allocate different numbers of spare blocks associated with each block type.

FIG. 1 illustrates a Flash memory device with a known method of allocating and using spare blocks. A spare block pool of single level cells (an SLC spare block pool) exchanges blocks exclusively with an SLC used block pool. A spare block pool of multi-level cells (a MLC spare block pool) exchanges blocks exclusively with a main user mapped memory of used MLC blocks. Bad blocks are exchanged for spare blocks, and the flash memory device can no longer write information to the bad blocks. The pools are set at the start of the life of the flash memory device. Since the usage of each data type is unknown, the maximum spare blocks are typically allocated to each of the SLC spare block pool and the MLC spare block pool. The solution in this case is however sub-optimal because at the end of the lifetime of the memory device, some of the spare blocks from either the SLC spare block pool or MLC spare block pool will typically not be used.

However, the rate of deterioration may be different for the different block types, such that when a spare block pool of one type is depleted, the memory device may reach the end of its usable life, even though there may be spare blocks of other types remaining. For example, at a certain point in the life of the device, there may be too few usable SLC blocks to maintain the specified flash memory card capacity while a surplus of MLC block types remain. The lifetime of the device will therefore end while usable MLC spare blocks are still available. Consequently, all of the flash memory blocks will be sub-optimally exploited during the lifespan of the device.

A similar problem arises when handling caching and buffering for the flash memory write operation or when executing the static and dynamic wear leveling processes. Buffer and cache operations and static and dynamic wear leveling processes may both require use of spare blocks. A problem may arise when there are too few good blocks of one of the block populations, e.g., SLC, MLC, to allocate for buffering and caching, or for static and dynamic wear leveling.

For the foregoing reasons, there is a need for a flash memory method that ensures optimal usage of all blocks throughout the life of the flash memory device and increases longer flash memory device lifespan.

SUMMARY OF EMBODIMENTS OF THE INVENTION

Embodiments of the present invention provide systems and methods for using Flash memory by allocating a first portion of spare blocks in the Flash memory as a single level cell (SLC) spare block pool, and allocating a second portion of spare blocks in the Flash memory as a multi-level cell (MLC) spare block pool. Bad SLC blocks in the Flash memory may be replaced with spare blocks from the SLC spare block pool. If the number of spare blocks in the SLC spare block pool is less than a minimum SLC spare pool threshold, then spare blocks from the MLC spare block pool may be re-allocated to the SLC spare block pool.

Embodiments of the present invention provide systems and methods for using non-volatile memory by allocating N number of portions of spare blocks in the non-volatile memory as N number of multi-level cell (MLCx(N)) spare block pools.

Bad MLCx(j) blocks in the non-volatile memory may be exchanged with spare blocks from an MLCx(j) spare block pool. If the number of spare blocks in an MLCx(j) spare block pool is less than a minimum MLCx(j) spare pool threshold, spare blocks may be transferred from the MLCx(j+1) spare block pool to the MLCx(j) spare block pool.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
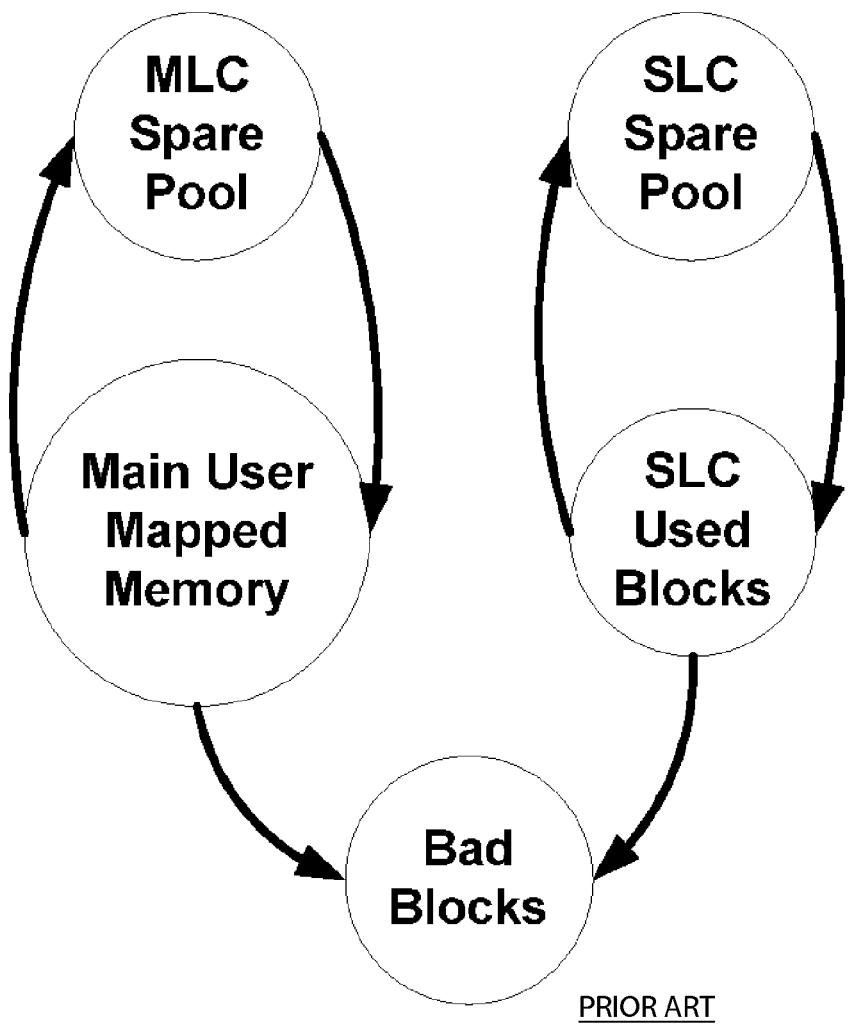
FIG. 1 schematically illustrates a prior art method for allocating and using spare pools of MLC and SLC blocks.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently.

According to embodiments of the present invention, a common spare block pool may be used in a Flash memory so as to increase the usable lifetime of a Flash memory device by more fully exploiting spare memory blocks.

Figure 2:
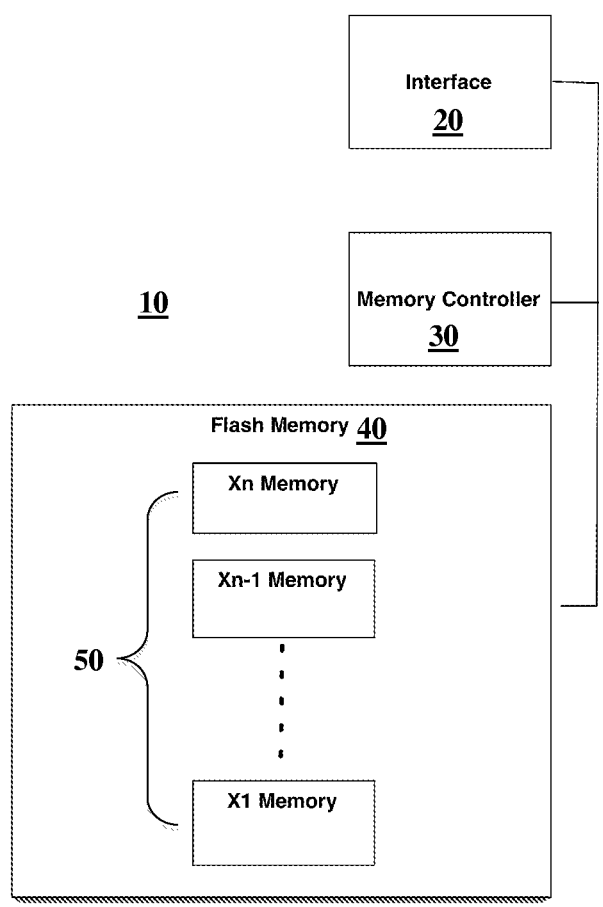
FIG. 2 schematically illustrates a structure of a Flash memory device according to an embodiment of the present invention.

FIG. 2 schematically illustrates a flash memory device 10. The flash memory device comprises an interface 20, a memory controller 30, and a flash memory module 40. The flash memory module comprises multiple (n) memory arrays 50. The memory controller 30 manages the reading, writing, erasing, and location of data stored in the flash memory module 40. The memory controller 30 also manages the exchange of flash memory blocks between different pools of flash memory blocks in the flash memory module 40. The memory controller 30 also controls buffering and caching operations; bad block management; and static and dynamic wear leveling processes within the flash memory module 40. It will be recognized that in some embodiments of the invention, the memory controller 30 may be integrated into the flash memory module.

According to embodiments of the invention, upon initialization of the Flash memory, a common pool of spare blocks may be apportioned as a pool of spare SLC blocks and a pool of spare MLC blocks. More specifically, in some embodiments of the invention, an initial number of the spare blocks may initially be allocated as a pool of spare SLC blocks, and the remainder of the spare blocks may be allocated as a pool of spare MLC blocks. The initial number of spare blocks allocated for use as a spare pool of SLC blocks may be a small number, for example, the minimum number of spare blocks required for smooth operation of the SLC memory cells, for example, two spare blocks. The remainder of the spare blocks may be allocated for use as a spare pool of MLC blocks.

As described below, during use of the Flash device, memory blocks in use are periodically tested to identify bad blocks, and bad blocks are exchanged with spare blocks from the spare block pool of the corresponding type. According to embodiments of the invention, upon reaching below a minimum level of spare SLC blocks, spare blocks allocated to the MLC spare block pool may be transferred to the SLC spare block pool to maintain a minimum number of spare blocks. Additionally or alternatively, according to embodiments of the invention, MLC blocks in use may be transferred to the SLC spare block pool upon reaching a use condition, such as a maximum MLC bearable cycle count. SLC blocks that reach a maximum cycle count may be declared bad blocks. When no more MLC spare blocks are available, the Flash device may end its lifetime.

Figure 3:
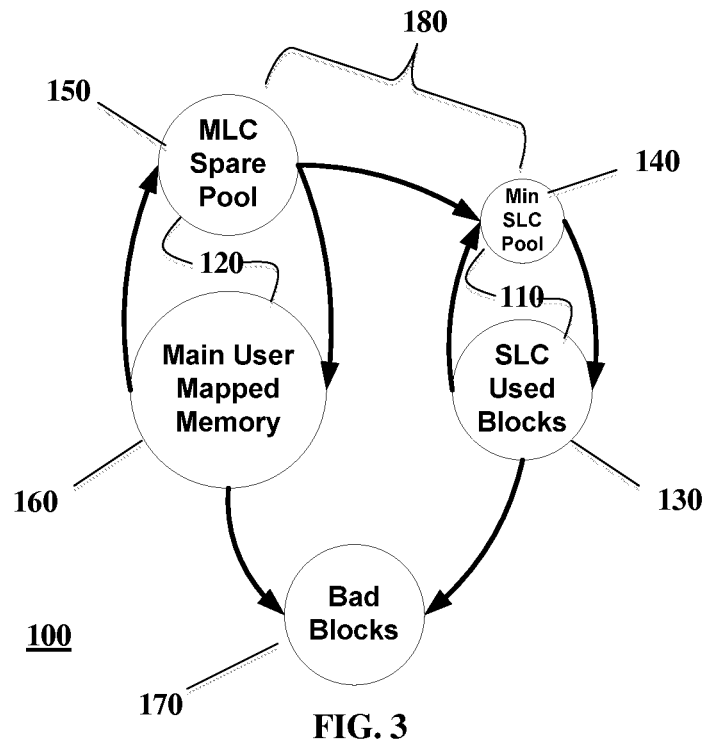
FIG. 3 illustrates a method for allocating and using spare pools of MLC and SLC blocks in accordance with an embodiment of the present invention having one type of MLC.

FIG. 3 schematically illustrates the functional processing of blocks in an MLC Flash memory device 100 according to an embodiment of the present invention having one type of MLC. It will be understood that FIG. 3 is a schematic illustration, and that blocks are not physically moved between or among pools, but rather various data structures, e.g., look-up tables, pointers, etc., which may be used to identify spare blocks of various types, blocks in use, and bad blocks, etc., may be modified as if to move or exchange an association of various blocks from spare block to block in use, or from block in use to bad block, etc.

As shown in FIG. 3, Flash memory device 100 may include an SLC flash memory array 110 and an MLC flash memory array 120. The SLC flash memory array 110 comprises an SLC used memory pool 130 and a number of spare blocks allocated as SLC spare blocks pool 140. As mentioned above, in an embodiment of the invention, SLC spare blocks pool 140 may initially be determined as a minimum number of spare blocks required for smooth functioning of the SLC memory array, such that only the minimum requisite spare blocks required for the SLC flash memory array 110 to function according to the SLC flash memory array 110 and flash memory device 100 specifications are initially provided. The MLC flash memory array 120 also comprises an MLC used block pool 160 and an MLC spare block pool 150. The remaining spare blocks, e.g., those spare blocks not assigned to the SLC spare block pool may be allocated to the MLC spare block pool 150.

For example, in an embodiment of the invention, the SLC flash memory array 110, may require 10 usable SLC blocks and one spare SLC block at any arbitrary moment for smooth operation. A total of 11 SLC blocks may therefore be allocated to the SLC flash memory array 110 at system initialization, ten blocks of which are for general use in the SLC used memory pool 130, and one block of which is allocated to the SLC spare blocks pool 140. The remaining blocks are allocated to the MLC spare block pool 150.

According to an embodiment of the invention, during normal operation of the flash memory device 100, the memory controller 30 may scan and test the flash memory arrays to identify bad blocks 170. Various methods are known for testing for bad blocks, which are not described herein for purposes of brevity. If a bad block 170 is discovered in the MLC flash memory array 120, the MLC bad block may be exchanged with a spare block from the MLC spare block pool 150. If a bad block is discovered in the SLC flash memory array 110, the bad block may be exchanged with a spare block from the SLC spare blocks pool 140.

In some embodiments of the invention, the memory device may require a predetermined minimum number of spare SLC blocks to be available at any time. Therefore, according to embodiments of the invention, when, for example, due to usage of SLC spare blocks, the number of available spare SLC blocks falls below this minimum, spare blocks from the MLC spare pool may be transferred, or re-allocated for use as SLC spare blocks as required.

In an embodiment of the invention, dynamic and static wear leveling operations may be performed within the SLC flash memory array 110 and the MLC flash memory array 120. Dynamic and static wear leveling operations may be performed, for example, in order to extend the useful life of the Flash memory device. Each flash memory block is typically rated for a certain number of P/E cycles. For example, MLC blocks may be rated for 3,000 P/E cycles and SLC blocks may be rated for 50,000 P/E cycles. Dynamic and static wear leveling may prevent or delay some blocks of memory from exceeding a predetermined P/E cycle threshold while other blocks have endured fewer P/E cycles by distributing Flash cell erasures and re-writes evenly across the Flash memory array.

In an embodiment of the invention, MLC blocks from the MLC flash memory array 120 that reach a predetermined maximum MLC bearable P/E cycles may be transferred to the SLC spare block pool 140 and called into use as SLC blocks as required. In some embodiments of the invention, a maximum number of bearable P/E cycles for an MLC block may be approximately 3,000 P/E cycles; a maximum number of bearable P/E cycles for an SLC block may be approximately 50,000 P/E cycles. According to embodiments of the invention, MLC blocks, therefore, may be used as SLC blocks after exceeding the maximum P/E cycle rating for an MLC block but while still less than the maximum P/E cycle rating for SLC blocks. SLC blocks that reach the maximum P/E cycle count for an SLC block may be declared bad blocks. Accordingly, the end of the Flash memory device's life may be declared when the number of remaining MLC spare blocks is zero. In some embodiments of the invention, when a device reaches the end of its lifetime, no more writes may be allowed, and the device may be declared Read-Only.

Figure 4:
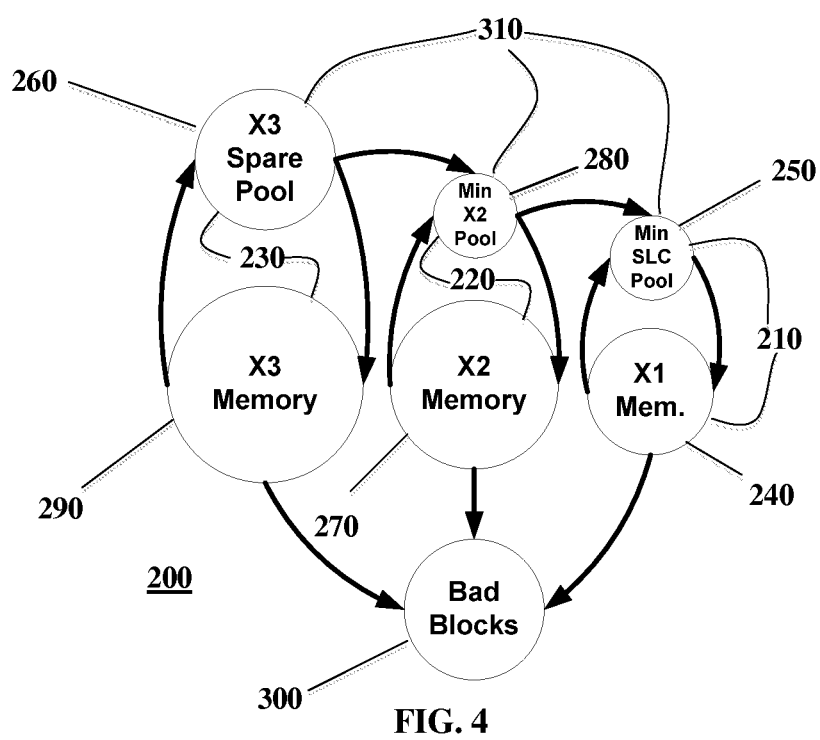
FIG. 4 illustrates a method for allocating and using spare pools of MLC and SLC blocks in accordance with an embodiment of the present invention having two types of MLC.

FIG. 4 schematically illustrates an embodiment of the invention having three populations of block types, e.g., MLCx3, MLCx2, and SLC. Flash memory device 200 comprises an SLC flash memory array 210, a MLCx2 memory array 220, and a MLCx3 memory array 230. The SLC flash memory array 210 comprises an SLC used memory pool 240 and a small number of spare blocks initially allocated to a SLC spare block pool 250. In some embodiments of the invention, a minimum number of spare blocks required for the smooth operation of SLC flash memory array 210 may be initially provided. MLCx2 memory array 220 comprises an MLCx2 used block pool 270 and a small number of spare blocks initially allocated to an MLCx2 spare block pool 280. In some embodiments of the invention, a minimum number of spare blocks required for the smooth operation of MLCx2 memory array 220 may be initially provided. As discussed below, because the spare blocks in the MLCx2 spare block pool 280 may be used as MLCx2 spare blocks and/or SLC spare blocks, the MLCx2 spare block pool 280 may function as a common spare block pool for the MLCx2 and SLC blocks in use. The remaining spare blocks may be allocated to MLCx3 spare block pool 260. As discussed below, because the spare blocks in the MLCx3 spare block pool 260 may be used as MLCx3 spare blocks, MLCx2 spare blocks, and/or SLC spare blocks, the MLCx3 may function as a common spare block pool for the MLCx3, MLCx2 and SLC blocks in use.

During normal operation of Flash memory device 200, memory controller 30 may regularly scan and test the memory arrays to identify bad blocks, e.g., a bad SLC block is discovered, or a SLC memory block has exceeded the prescribed maximum number of bearable P/E cycles. In an embodiment of the invention, bad SLC blocks in use in SLC used memory pool 240 may be exchanged for good SLC blocks from SLC spare block pool 250. Bad MLCx2 blocks in use in MLCx2 used block pool 270 may be exchanged for good MLCx2 blocks from MLCx2 spare block pool 280. Bad MLCx3 blocks in use in MLCx3 blocks 290 may be exchanged for good MLCx3 blocks from MLCx2 spare block pool 260.

As mentioned above, the number of SLC blocks allocated to the SLC spare block pool may be small, and therefore, the pool may be depleted of spare blocks after operation of SLC blocks in the device. Accordingly, if SLC blocks are no longer available in the SLC spare block pool, or if the number of spare blocks in the SLC spare block pool falls below a minimum threshold, e.g., a minimum number required for smooth operation of the SLC memory, a spare block from the MLCx2 spare block pool may be reallocated for the SLC spare block pool.

Likewise, the number of MLCx2 blocks allocated to the MLCx2 spare block pool may be small, and therefore, the pool may be depleted of spare blocks after operation of MLCx2 blocks in the device. Accordingly, if MLCx2 blocks are no longer available in the MLCx2 spare block pool, or if the number of spare blocks in the MLCx2 spare block pool falls below a minimum threshold, e.g., a minimum number required for smooth operation of the MLCx2 memory, a spare block from the MLCx3 spare block pool may be reallocated for the MLCx2 spare block pool.

In an embodiment of the invention, dynamic and static wear leveling operations may be performed in any one or more of the SLC flash memory array 210, the MLCx2 memory array 220, and the MLCx3 memory array 230 in order to increase the lifetime of the flash memory.

Additionally or alternatively, in an embodiment of the invention, MLCx3 blocks in use from the MLCx3 memory array 230 that reach maximum bearable cycle count for MLCx3 memory may be transferred to the MLCx2 spare block pool 280. Similarly, MLCx2 blocks in the MLCx2 memory array 220 that reach maximum bearable cycle count specified for MLCx2 memory may be transferred to SLC spare block pool 250. SLC blocks that reach the maximum bearable P/E cycle count for an SLC block may be declared bad blocks 300.

According to an embodiment of the invention, the end of the Flash memory device 200 life may be declared to occur when the number of MLCx3 spare blocks is less than a predefined minimum spare blocks required for the X3 flash memory device 200 to operate according to specification.

It will be understood that the above example involving one type of MLC block, e.g., an MLCx2, and SLC blocks may be generalized to include many types of MLC, e.g., MLCxN, MLCx(N−1) ... MLCx2 and SLC blocks. In such embodiments of the invention, each of the lower levels of cell blocks (SLC, MLCx2 ... MLCx(N−1)) may be allotted the minimum number of spare blocks, and upon a type of spare block pool being depleted of spare blocks, additional spare blocks may be allocated from the spare block pool of a higher-order MLC block pool. Additionally or alternatively, upon exhaustion of an MLC block in use by reaching a maximum number of bearable P/E cycles for that type of MLC block, e.g., MLCx(j), the block may be reallocated as a spare block of type MLCx(j−1). It will be understood that in an SLC block may be considered analogous to MLCx1.

Figure 5:
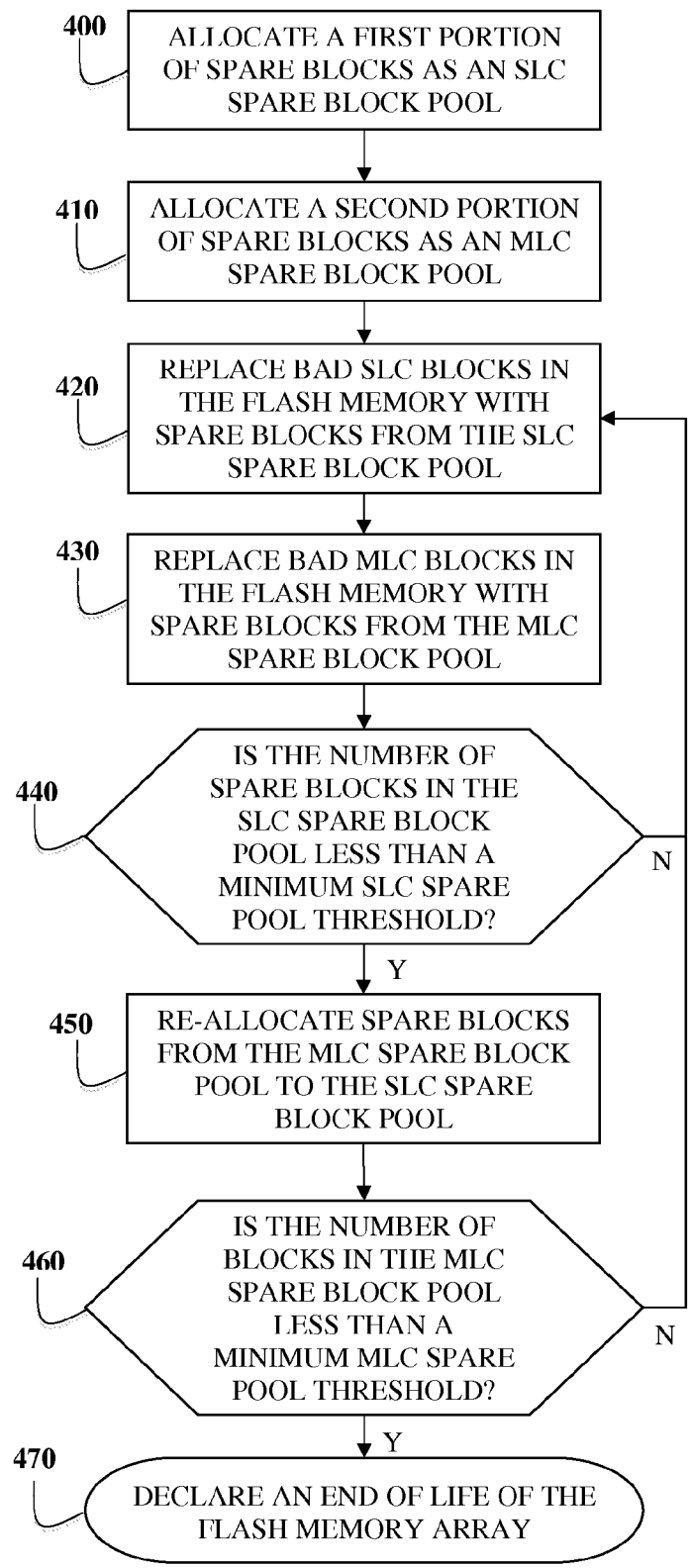
FIG. 5 is a flowchart of a method for allocating and using spare pools of MLC and SLC blocks according to an embodiment of the present invention.

FIG. 5 is a flowchart of a method for allocating and using spare pools of MLC and SLC blocks in Flash memory device 100 according to an embodiment of the present invention.

In operation 400, a controller (e.g., memory controller 30 of FIG. 2) may allocate a first portion of spare blocks as an SLC spare block pool (e.g., SLC spare blocks pool 140 of FIG. 3). The controller may, in some embodiments, allocate a minimum number of spare blocks needed for smooth operation of the SLC memory cells (e.g., SLC flash memory array 110 of FIG. 3) and/or the Flash memory device (e.g., Flash memory device 100 of FIG. 1).

In operation 410, the controller may allocate a second portion of spare blocks as an MLC spare block pool (e.g., MLC spare block pool 150 of FIG. 3). The controller may, in some embodiments, allocate to the MLC spare block pool all spare blocks not assigned to the SLC spare block pool.

In operation 420, the controller may replace bad SLC blocks in the Flash memory with spare blocks from the SLC spare block pool. An SLC block or other type of Flash memory block may become a bad block, for example, if the block is programmed and erased a number of times exceeding the P/E cycle maximum for the SLC block. Flash memory blocks may also become bad blocks by erase failure, or other causes.

In operation 430, the controller may replace bad MLC blocks in the Flash memory with spare blocks from the MLC spare block pool.

In operation 440, the controller may determine if the number of blocks in the SLC spare block pool is less than a minimum SLC spare pool threshold (e.g., the minimum number of SLC blocks necessary for smooth function of the SLC memory cells and/or the Flash memory device). If the number of blocks in the SLC spare block pool is less than a minimum SLC spare pool threshold, a process or the controller may proceed to operation 450. If the number of blocks in the SLC spare block pool is equal to or greater than a minimum SLC spare pool threshold, a process or the controller may proceed to operation 420.

In operation 450, the controller may re-allocate spare blocks from the MLC spare block pool to the SLC spare block pool. The controller may, in some embodiments, transfer or re-allocate MLC spare blocks whose P/E cycles have exceeded the maximum P/E cycle rating for an MLC block but not the maximum P/E cycle rating for an SLC block. Any MLC block, or other type of block, that has not exceeded the maximum P/E cycle rating for SLC blocks may be re-allocated to the SLC spare block pool.

In operation 460, the controller may determine if the number of blocks in the MLC spare block pool is less than a minimum MLC spare pool threshold. If the number of blocks in the MLC spare block pool is less than a minimum MLC spare pool threshold, a process or controller may proceed to operation 470. If the number of blocks in the MLC spare block pool is greater than or equal to a minimum MLC spare pool threshold, a process or controller may proceed to operation 420.

In operation 470, the controller may declare an end of life of the Flash memory array.

Other operations or orders of operations may be used.

Embodiments of the invention may demonstrate one or move advantages, including, without requirement or limitation, ensuring optimal usage of all blocks throughout the life of the Flash memory device, increased spare block resources for the buffer and cache processes within the Flash device, longer Flash memory device lifespan, and/or reducing environmental waste from expired flash memory devices.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A method of operating a Flash memory array, the method comprising:
    allocating a first portion of spare blocks in the Flash memory array as a single level cell (SLC) and a first type of multi-level cell (MLC) spare block pool, and a second portion of spare blocks in the Flash memory array as a second type of MLC spare block pool;
        wherein the second type of MLC is more prone to error that the first type of MLC;
        wherein the first type MLC is used for storing more than a single bit per cell and less bits per cell than the second type of MLC;
        wherein spare blocks of the first portion of the spare blocks have a program and erase cycle count value that does not exceed a maximal allowable program and erase cycle count of the first type of MLC blocks;
    replacing bad SLC blocks and bad first type MLC blocks in the Flash memory array with spare blocks from the SLC and first type MLC spare block pool; and
    if the number of spare blocks in the SLC and first type MLC spare block pool is less than a minimum SLC and first type MLC spare pool threshold, then re-allocating spare blocks from the second type MLC spare block pool to the SLC and first type MLC spare block pool.

2. The method of claim 1, further comprising: re-allocating second type MLC blocks reaching a maximum second type MLC bearable cycle count to the SLC and first type MLC spare block pool.

3. The method of claim 1 wherein the first type MLC is used for storing two bits per cell and the second type MLC is arranged to store three bits per cell.

4. The method of claim 1, further comprising: declaring an end of life of the Flash memory array when the number of blocks in the second type MLC spare block pool is less than a minimum second type MLC spare pool threshold.

5. The method of claim 1, wherein the minimum SLC and first type spare pool threshold comprises a minimum number of spare blocks required for smooth operation.

6. A Flash memory device comprising: a plurality of Flash memory blocks; and a controller that is arranged to:
- allocate a first portion of spare blocks in the Flash memory as a single level cell (SLC) and first type multi-level cell (MLC) spare block pool, and a second portion of spare blocks in the Flash memory as a second type multi-level cell (MLC) spare block pool;
- wherein the first type MLC is used for storing more than a single bit per cell and less bits per cell than the second type of MLC;
- wherein the second type of MLC is more prone to error that the first type of MLC;
- wherein spare blocks of the first portion of the spare blocks have a program and erase cycle count value that does not exceed a maximal allowable program and erase cycle count of the first type of MLC blocks;
- replace bad SLC and first type MLC blocks in the Flash memory with spare blocks from the SLC and first type MLC spare block pool; and
- if the number of spare blocks in the SLC and first type MLC spare block pool is less than a minimum SLC and first type MLC spare pool threshold, then re-allocate spare blocks from the second type MLC spare block pool to the SLC and first type MLC spare block pool.

7. The device of claim 6, wherein the controller is further configured to: re-allocate second type MLC blocks reaching a maximum second type MLC bearable cycle count to the SLC and first type MLC spare block pool.

8. The device of claim 6, wherein the first type MLC is used for storing two bits per cell and the second type MLC is used for storing three bits per cell.

9. The device of claim 6, wherein the controller is further configured to: declare an end of life of the Flash memory array when the number of blocks in the second type MLC spare block pool is less than a minimum second type MLC spare pool threshold.

10. The device of claim 6, wherein the minimum SLC and first type MLC spare pool threshold comprises a minimum number of spare blocks required for smooth operation.

11. A method of operating a non-volatile memory array, the method comprising:
- allocating less than N spare block pools for N types of non-volatile memory cells that comprise (N−1) types of multi-level cell (MLC) non-volatile memory cells MLCx(N)-MLCx(2) and a single level cell (SLC) non-volatile memory cells MLCx(1) thereby at least two types of non-volatile memory cells MLCx(j) and MLCx(j+1) share a spare block pool MLCx(j+1);
- wherein index j ranges between N−2 and 1;
- wherein N exceeds two;
- wherein spare blocks of the spare block pool MCLx(j+1) have a program and erase cycle count value that does not exceed a maximal allowable program and erase cycle count of the MLC(j+1) blocks;
- wherein a MLCx(j) non-volatile memory cell is arranged to store j bits;
- exchanging bad MLCx(j) and MLCx(j+1) blocks in the non-volatile memory with spare blocks from the MLCx(j+1) spare block pool; and
- if the number of spare blocks in the MLCx(j+1) spare block pool is less than a minimum MLCx(j+1) spare pool threshold, then transferring spare blocks from a MLCx(j+2) spare block pool to the MLCx(j) spare block pool.

12. The method of claim 11, wherein j equals one.

13. The method of claim 11, wherein the non-volatile memory array comprises a Flash memory array.

14. The method of claim 11, wherein N is greater or equal to three.

15. The method of claim 11, further comprising: transferring MLCx(j+2) blocks reaching a maximum MLCx(j+2) bearable cycle count to the MLCx(j+1) spare block pool.

16. The method of claim 11, further comprising: declaring an end of life of the non-volatile memory array when a number of blocks in a MLCxN spare block pool is less than a minimum MLCxN spare pool threshold.

\* \* \* \* \*